United States Patent [19]

Puckette

[11] 4,290,022
[45] Sep. 15, 1981

[54] DIGITALLY PROGRAMMABLE PHASE SHIFTER

[75] Inventor: Charles M. Puckette, Schenectady, N.Y.

[73] Assignee: General Electric Company, Schenectady, N.Y.

[21] Appl. No.: 30,013

[22] Filed: Apr. 16, 1979

[51] Int. Cl.³ .......................... H03K 5/15; H03K 3/86
[52] U.S. Cl. ..................... 328/55; 328/109; 328/154
[58] Field of Search .................. 328/55, 109, 110, 155, 328/152, 154

[56] References Cited

U.S. PATENT DOCUMENTS

| | | | |
|---|---|---|---|
| 2,881,320 | 4/1959 | Goldberg | 328/155 X |
| 2,910,586 | 10/1959 | Kohler | 328/155 |
| 3,500,214 | 3/1970 | Broadhead et al. | 328/55 X |
| 3,502,994 | 3/1970 | Ott et al. | 328/155 |
| 3,781,706 | 12/1973 | Osburne et al. | 328/155 X |
| 3,876,949 | 4/1975 | Encellaz et al. | 328/155 X |
| 4,193,038 | 3/1980 | Kashio | 328/154 X |
| 4,215,314 | 7/1980 | Addor | 328/55 |

*Primary Examiner*—John S. Heyman
*Attorney, Agent, or Firm*—Geoffrey H. Krauss; James C. Davis; Marvin Snyder

[57] ABSTRACT

A phase shifter is disclosed which provides a reference-phase square-wave as a first output and a second square-wave of the same frequency as the reference-phase square-wave and having the phase thereof shifted, with respect to the reference-phase square-wave, synchronously by a phase increment which is programmable in steps equal to $360/2^N$ degrees, where N is an integer equal to number of stages in a shift register receiving binary phase control information.

10 Claims, 3 Drawing Figures

DIGITALLY PROGRAMMABLE PHASE SHIFTER

BACKGROUND OF THE INVENTION

The present invention relates to digitally programmable phase shifters and, more particularly, to a novel programmable phase shifter having a phase-shifted output at which a signal appears with synchronously switched phase, with respect to a reference-phase output.

It is often required that a signal having a referenced phase be phase shifted to provide a second signal of identical frequency and having a phase different from the first signal, which phase difference, or phase shift, can be not only programmably selected in a "random" fashion, but also wherein switching between various amounts of phase shift can be achieved in synchronous manner whereby erroneous transients are not generated in the phase-shifted output signal.

A number of techniques are known in the prior art for providing an output signal having a phase shifted from the phase of a reference signal. In particular, digital signals may be phase-shifted by means of a count-down chain wherein the count is either inhibited or advanced by one count in order to change the phase respectively in a lagging or leading direction. In this count-down-chain phase-shifter, a constant clock frequency train of pulses at the input to the circuit has an extra clock pulse "stuffed" into the clock pulse train in order to advance the count, whereby the maximum possible average clock rate usable with this form of phase shifter is reduced to about one-half the clock rate of the counter utilized for counting the clock pulse train. This reduction in maximum average clock rate is required so that the "stuffed" pulse will still satisfy the timing specifications of the clock pulse counter. This reduction in maximum average clock rate limits the number of phase increments which may be achieved at a given output frequency. If the "stuffed" pulse technique is not utilized, phase changes are limited to changes in the lagging direction only. Phase shifters using a count-down chain require that the total phase change be created by summation of the required number of incremental phase changes whereby the time required to realize a desired phase change, equal to K incremental phase changes, is equal to the time required to implement the minimum phase change K times, and further limits the maximum frequency of phase-shift operations. It is therefore desirable to implement a phase shifter of the programmable type, which does not require the addition, or "stuffing", of one or more extra clock pulses and subsequently allows the phase-shift circuitry to operate at the maximum specified frequency of the logic components thereof, thereby achieving a minimum possible phase step increment, and hence the maximum number of programmable phase increments, for a given output frequency. It is also desirable that the amount of phase shift can be programmed in a random manner so that any desirable phase relationship can be programmed with a single change in the phase shift control data to the circuitry. It is also desirable that the operation of the phase shift circuit be synchronous with a common phase-shift circuitry clock signal, whereby problems with so-called "gating slivers" may be avoided.

BRIEF SUMMARY OF THE INVENTION

In accordance with the invention, a digitally programmable phase shifter comprises a multi-output phase-shift means, such as a digital tapped delay line, receiving input square-wave signals at the desired output frequency and having a total delay equal to (1/T) of the input square-wave. The phase-shift means, e.g. the tapped delay line with a total of K taps, has K outputs each at the same frequency but with a time delay ($t_d$) between outputs of ($t_d = T/K$). Each of the outputs of the phase-shift means, such as a tap of the delay line, is fed to one input of a 1-of-K data selector. The data selector control inputs are programmed to cause one of the K phase-shifted square-waves at the selector inputs, from the tapped delay line, to be coupled to the selector output where it appears as a square-wave having the input square-wave frequency, and having a phase that is phase-shifted from the phase of the input square-wave in programmable increments of ($2\pi/K$) radians.

In one preferred embodiment of the present invention, the multi-output phase-shifting means is a digital shift register, having K stages, that is clocked at a rate K times the input square-wave. A digital latch is utilized between the one-of-K selector and the input data lines upon which phase control data appear, with the data being clocked into the digital latch synchronously by the shift register clock signal, of frequency K times the output frequency. Changes in the plase of the output square-wave therefore occur synchronously with respect to an edge of the input square-wave, thereby avoiding "gating slivers".

Accordingly, it is an object of the present invention to provide a digitally programmable phase shifter whose phase shifted output does not contain "gating slivers" and whose dwell time at a specific phase setting is an integer multiple of $t_d$.

This and other objects of the present invention will become apparent upon consideration of the following detailed description, taken in conjunction with the drawings.

DETAILED DESCRIPTION OF THE INVENTION

Figure 1:
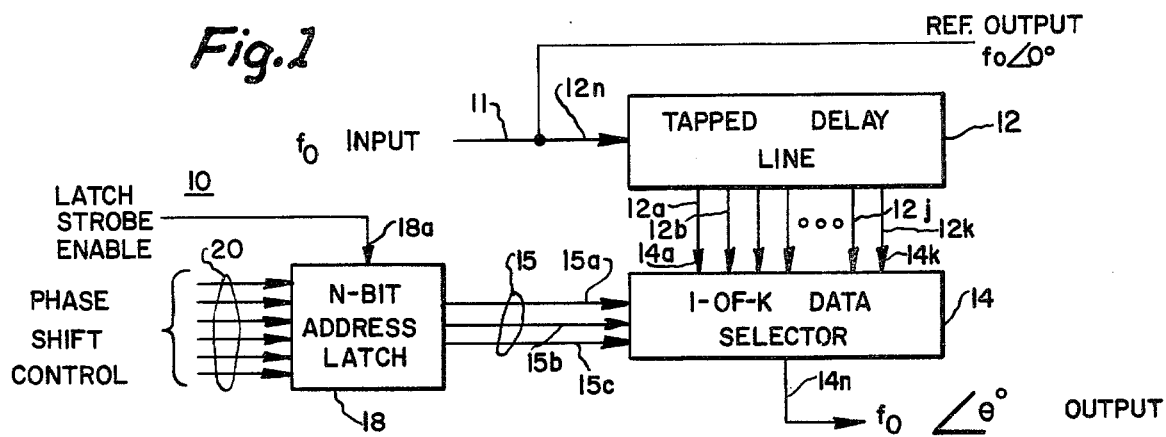
FIG. 1 is a block diagram illustrating the principles of the present invention.

Referring initially to FIG. 1, a digitally programmable phase shifter 10 receives a square-wave input signal at a desired output frequency $f_0$, on line 11. The digital square-wave signal is fed into means 12 having a plurality K of outputs each at the input frequency but having progressively larger phase shifts $\phi$ with respect to the phase of the input signal; the phase $\phi$ of the H-th output, where $1 \leq H \leq K$, is $\phi_H = 360/K \times H$, if the phase shift means has a total delay of one period, from input to the last (Kth) output, at the input frequency. Preferably, the phase-shift means is a tapped delay line 12 having a plurality K of outputs 12a, 12b, . . . 12k, each having a progressively greater delay with respect to the delay line input 12n, and having essentially equal delays between each of the input and the first tap 12a and between each pair of the K taps. If the total delay between input 12n and the furthest tap 12k therefrom is set equal to $(1/T)$ of the input square-wave, where T is the period thereof, then the time delay $t_d$ between each tap is $(t_d = T/K)$. The phase increment, i.e. the difference between similar edges of the square waves from adjacent taps, is $(2\pi/K)$ radians or $(360/K)$ degrees.

The K taps $12a$–$12k$ from tapped delay line 12 are individually coupled to like-ordered inputs $14a$–$14k$ of a one-of-K data selector 14. A selected one of the phase-shifted square-waves appearing at inputs $14a$–$14k$ is coupled to data selector output $14n$ responsive to selection information appearing at data selector control inputs 15, which may be a plurality of input lines having the phase-selection information coded thereon. Advantageously, K is set equal to an integer (N) power of two, whereby binary logic can be utilized to implement data selector 14. Thus, $K = 2^N$, and, if $N = 3$, $K = 2^3 = 8$, whereby a total of $N = 3$ data selector lines $15a$, $15b$ and $15c$ would be required to select that one-of-eight taps $12a$–$12k$ to be coupled to data selector output $14n$, at which appears a square wave of frequency $f_0$ and having some phase angle $\theta$ in increments of $(360/K)°$, or 45° for $K = 8$, with respect to the phase of the input signal on line 11, which signal can be taken as a reference-phase first output signal.

The binary-coded information for the data selector 14 may be strobed in a N-bit address latch 18 (where $N = 3$ bits for $K = 8$) which latch receives and stores the phase shift control information on lines 20, as available from suitable external circuitry (not shown) determining the desired phase shift, and which latch 18 provides a steady N bit output to data selector 14. This is especially useful where the external apparatus supplying phase shift control information has additional tasks to complete and does not constantly provide phase shift control information. Thus, by allowing new phase control information to be provided to the data selector at times uniquely related to the transitions of the input square wave, "gating slivers" are eliminated and the duration of a given output phase is uniquely controlled. Accordingly, latch 18 also includes a strobe input $18a$ which, when enabled, allows latch 18 to acquire the phase shift control information then on input lines 20 and to provide that information to data selector 14 thereafter, and to disregard any additional information on lines 20 when input $18a$ is not energized.

Thus, outputs from phase shifter 10 are at the input frequency $f_o$ and at a selectable phase of $(2\pi N/K)$ radians where K is the number of taps (or phase increments) and N is an integer between zero and K.

Figure 2:
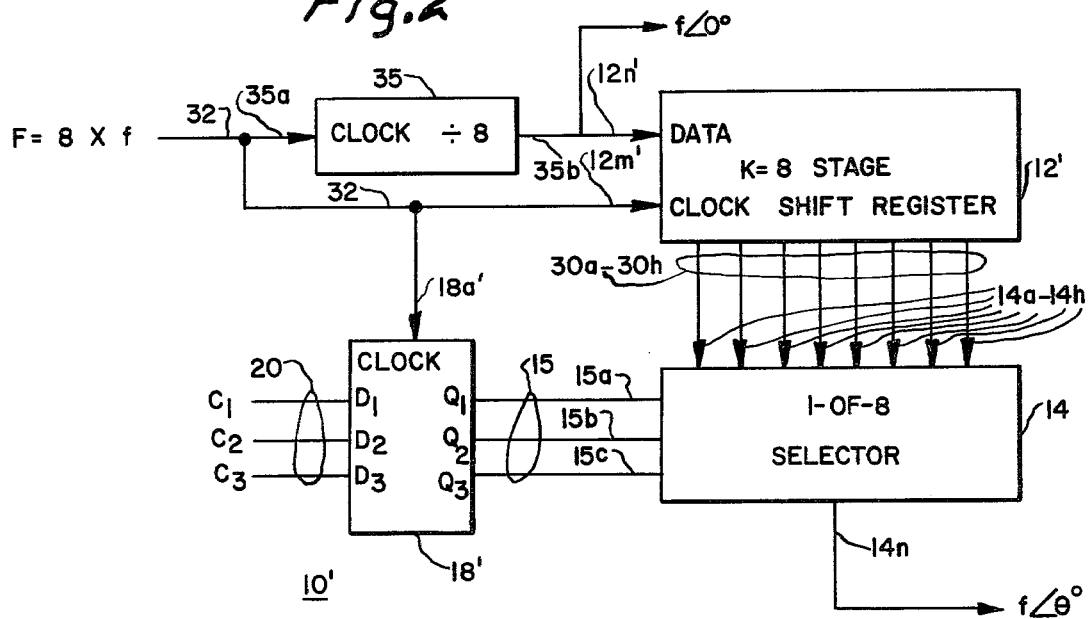
FIG. 2 is a block diagram illustrating the present invention for use in obtaining phase-shift increments of 45°.

Referring now to FIG. 2, digitally programmable phase shifter $10'$ utilizes a K-stage shift register $12'$ in place of the tapped delay line 12. Shift register $12'$ has a data input $12'n$, receiving the reference-phase square-wave signal at frequency f and establishing a reference phase angle of 0°; shift register $12'$ also receives clock pulses at a second input $12m'$, which clock pulses serve to shift the square-wave data signals at data input $12n'$ sequentially through the K ($=8$) stages of the shift register and provide delayed square-wave signals at each of the K shift register outputs $30a$–$30h$. If the clock pulses on clock line 32 to clock input $12m'$ occur at K tims the data frequency, i.e. the clock frequency $F = Kf$ (or $F = 8f$, for a $K = 8$ stage shift register $12'$), the total delay in clocking the input square-wave through the K stage shift register is equal to $(1/f)$ of the input square-wave, whereby the delay $t_d$ between a pair of adjacent shift register outputs, e.g. $30i$ and $30h$, is $t_d = (T/K)$ and is a phase increment of essentially $(2\pi/K)$ radians or $(360/K)°$. The input square wave, at input $12n'$, is itself derived from the clock frequency F, by division thereof by the number K; thus, a divider 35 has its input $35a$ receiving clock frequency F and provides an output $35b$, coupled to data input $12n'$ of the shift register, at the square-wave frequency $f = F/K$.

Each of the K shift register outputs $30a$–$30h$ is coupled to a like-designated one of the K inputs $14a$–$14h$ of selector 14. A selected one of the K inputs is coupled to selector output $14n$ in accordance with the binary coded data made available on data selector input lines $15a$–$15c$, from storage in latch 18, which latch receives its phase shift control information on lines $C_1$, $C_2$ and $C_3$. The strobe input $18a'$ is advantageously coupled to the clock line 32 and is enabled to receive new phase shift control data inputs at the clock frequency rate, whereby any change in the phase increment, as selected via selector 14, is in response to a change in binary-coded information, on lines 15, which information is only clocked into latch $18'$ at an edge of the clock frequency waveform on line 32. The proper one of the rising or falling edges of the clock waveform is thus used for clocking new data into latch 18 and also for accomplishing the phase shift of the waveform selected to be coupled to output $14n$; by the addition of an inverter (not shown) between clock line 32 and clock data input enable input $18a$, the opposite edge of the waveform may be used as the clocking edge. In this manner the phase-increment-determining information is stored in the latch at the same time that the input frequency square-wave information is shifted into the shift register, so that a new phase is programmed concurrent with level transitions in the output square-wave and a full half-square-wave-interval is gated out for the first level change at the new phase increment, without the appearance of a gated "sliver" of a square-waveform.

Figure 3:
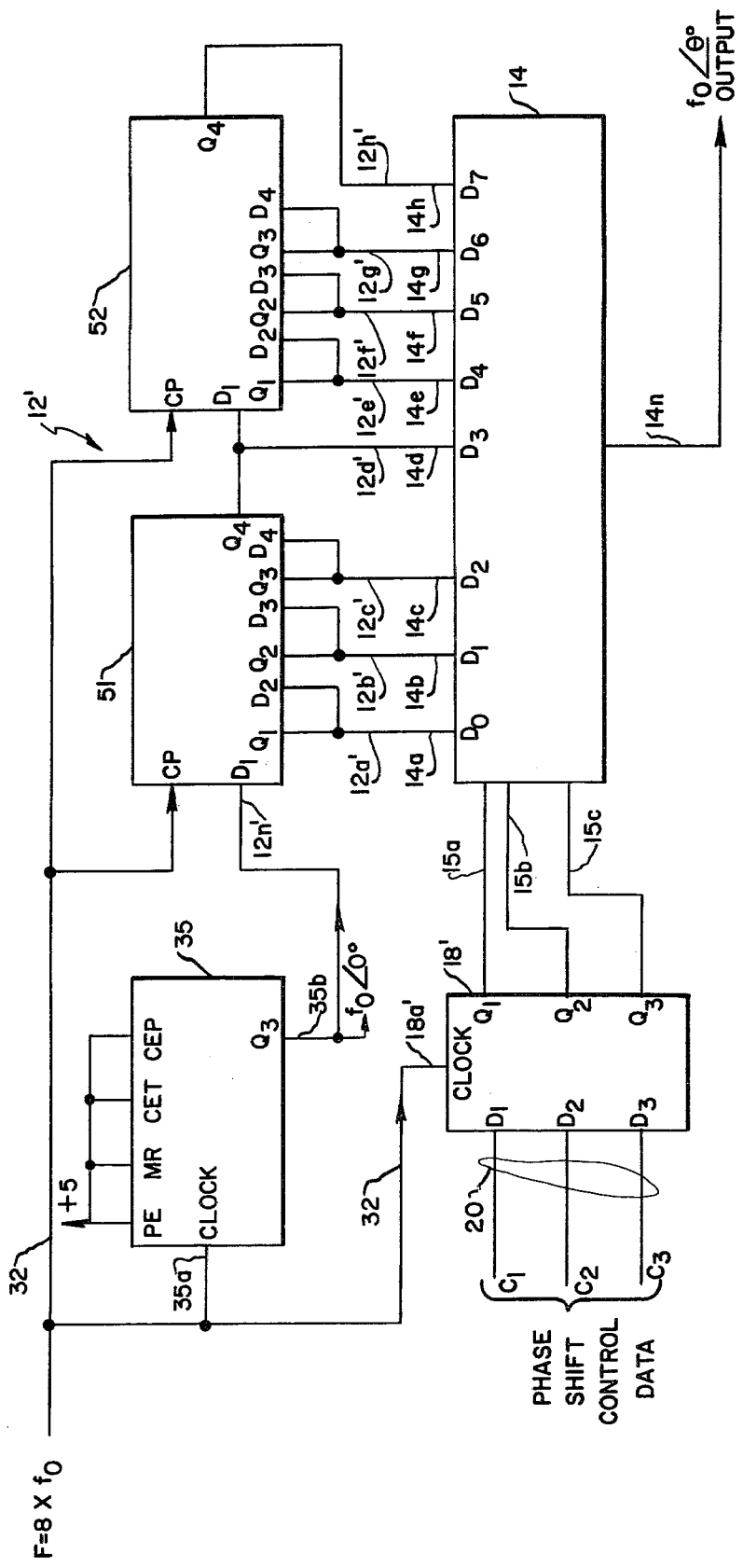
FIG. 3 is a schematic block diagram of a particular preferred implementation of the 45°-increment phase shifter of FIG. 2.

Referring now to FIG. 3, a phase shifter providing essentially equal phase increments of $\pi/4$ radians, or 45°, is illustrated. The 8-stage shift register $12'$ is implemented with a pair of 4-stage shift registers 51 ad 52, in series connection. Each of the 4-stage shift registers is advantageously implemented with integrated circuitry, whereby, if Schottky-type TTL logic is utilized, the shift registers may be of the 74S175 and the like type. Each of the shift registers has a clock pulse input CP, connected in electrical parallel connection to clock line 32, having the clock frequency F, equal to K times the output frequency ($8f_0$) thereon. Clock pulse line 32 is also coupled to the strobe input $18a'$ of the latch $18'$, which may also be a 74S175 and the like type integrated circuit. The clock-divide-by-K stage 35 is implemented with a divide-by-8 counter 35 which may be of the 74S161 type, wherein clock pulses received at clock input $35a$ enable a square-wave to appear at the third output $Q_3$ of the counter with frequency $f_0$ at a reference phase of zero degrees, for coupling to the data input $12n'$ of the K-stage shift register $12'$. Data input $12n'$ of the shift register is the data-1 input $D_1$ of the first shift register stage 51. Each of the first, second and third stage outputs, e.g. $Q_1$, $Q_2$ and $Q_3$, respectively, of each shift register integrated circuit are coupled not only to the associated input, e.g. $14a$, $14b$ and $14c$, respectively, of the one-of-K data selector 14 (which may be a 74S151 and the like type integrated circuit) but are also coupled to the data inputs of the next-successive shift register stage. Thus, the output $Q_1$ of the first shift register stage is coupled to the data input $D_2$ of the second shift register stage, while the second stage output $Q_2$ is coupled to the third stage input $D_3$ and the third stage output $Q_3$ is coupled to the fourth stage data input $D_4$. The output $Q_4$ of the fourth stage is coupled to the associated data selector input $14d$ and also to the input $D_1$ of the first stage of the next successive shift register integrated circuit 52. The data inputs an outputs of each shift register integrated circuit are connected similar to that of the inputs and outputs of the first integrated circuit 51, with the exception that the data output $Q_4$ of the last shift register stage is connected only to the last remaining input 14–14L of data selector 14.

As previously explained hereinabove, the phase shift control data input lines 20 are coupled to selector 14 via latch 18' and lines 20 connect directly only to the data inputs of latch 18. As there are $K = 8 = 2^3$ possible phase increments which can be programmed, only three control lines $C_1$, $C_2$ and $C_3$ are required.

The clock rate capability of the Schottky-TTL logic described hereinabove is on the order of 60MHz., whereby the maximum output frequency, of the output waveform appearing at data selector output $14n$, is equal to the maximum clock frequency divided by the number of phase increments K, or about 7.5MHz. for $K = 8$. If an additional pair of 4-stage shift registers are added in sequence after shift register 52, and if selector 14 is a one-of-sixteen data selector and divider 35 is a divide-by-16, then the maximum output frequency would be 60/16 or 3.75 megacycles, but with a phase increment of $(2\pi/16)$ radians, or $360/16 = 22.5$ degrees, programmable. Higher frequency performance may be obtained by using integrated circuit logic having inherently higher speed/frequency capability, such as emitter-coupled logic (ECL) integrated circuits. Similarly, if operation at lesser output frequencies is required, other forms of discrete and/or integrated logic circuitry, having lower maximum clock frequencies, may be utilized.

While the present invention has been described herein with reference to one presently preferred embodiment thereof, many variations and modifications will now occur to those skilled in the art. It is my intent, therefore, to be limited only by the scope of the appending claims and not by the specific embodiments described herein.

What is claimed is:

1. Apparatus for providing an output signal having a phase shifted with respect to the phase of an input signal, comprising:

first means receiving said input signal, having the desired output frequency, for simultaneously providing the input signal at a reference phase and a plurality K of signals each having the same waveshape as the input signal and at the input frequency and with each signal having a different one of K phases of $2\pi N/K$ radians, with respect to the input signal phase, where N is an integer between one and K; and second means for synchronously selecting one of the K signals from said first means to provide the phase shifted output signal with a selected phase and with all phase shift changes occurring at transitions of the input signal.

2. Apparatus as set forth in claim 1, wherein said first means comprises a single delay line having an input receiving said input signal and having a plurality K of taps, the phase shift between said input and the first of said plurality of said taps, and between each adjacent pair of successive taps, being substantially equal.

3. The apparatus as set forth in claim 2, wherein the total delay along said delay line is equal to the reciprocal of the frequency of the input signal.

4. The apparatus as set forth in claim 3, wherein the phase increment between said input and the first-encountered output tap, and between each adjacent pair of output taps, is equal to (360/K) degrees.

5. The apparatus as set forth in claim 2, wherein said second means is a one-of-K selector having an output coupled to a selectable one of a plurality K of inputs, with each input being coupled to an associated and like-ordered one of the plurality of outputs from said delay line.

6. The apparatus as set forth in claim 1, wherein the number K of the plurality of selectable output signal is equal to an integer power of base 2.

7. The apparatus as set forth in claim 1, wherein said input signal is a square-wave signal and said first means is a shift register having a total of K stages; said shift register having a data input at which said input signal appears and a clock input at which a signal of frequency K times the frequency of the input signal appears for clocking the signal at the data input through the K stages of the shift register at a rate K times faster than the frequency of said input signal.

8. The apparatus as set forth in claim 7, further comprising means for dividing the frequency of the clock signal by the factor K to provide the square-wave input signal to the data input of said first means.

9. The apparatus as set forth in claim 1, further including latch means receiving phase shift control information for causing said second means to select only a desired one of said K signals responsive at a selected time to a signal designating the desired phase of said output signal.

10. The apparatus as set forth in claim 9, wherein said latch means is enabled to receive phase-shift control information only during one of the rising and falling edges of the clock waveform applied to said first means, whereby the selected phase of the output signal appears in synchronism with the clock waveform.

* * * * *